United States Patent
Horng

(10) Patent No.: US 6,346,672 B1
(45) Date of Patent: Feb. 12, 2002

(54) STRUCTURE FOR PREVENTING ELECTROMAGNETIC INTERFERENCE OF CENTRAL PROCESSING UNIT

(76) Inventor: Chin Fu Horng, No. 9, Lane 90, Fu Hsing Rd., Lu Chou, Taipei Hsien (TW)

( * ) Notice: Subject to any disclaimer, the term of this patent is extended or adjusted under 35 U.S.C. 154(b) by 0 days.

(21) Appl. No.: 09/609,758

(22) Filed: Jul. 3, 2000

(51) Int. Cl.$^7$ .............................. H05K 9/00; H05K 7/20
(52) U.S. Cl. ..................... 174/35 R; 361/704; 361/816; 361/818
(58) Field of Search ........................ 174/35 R; 361/704, 361/707, 709, 710, 711, 816, 818; 165/80.2, 80.3; 257/706, 710, 712, 713, 718

(56) References Cited

U.S. PATENT DOCUMENTS

| | | | | |
|---|---|---|---|---|
| RE32,370 E | * | 3/1987 | Bright et al. | ............ 339/17 CF |
| 5,241,453 A | * | 8/1993 | Bright et al. | ................ 361/704 |
| 5,311,395 A | * | 5/1994 | McGaha et al. | ............ 361/720 |
| 5,566,052 A | * | 10/1996 | Hughes | ........................ 361/704 |
| 5,771,960 A | * | 6/1998 | Lin | ............................ 165/80.3 |
| 6,219,239 B1 | * | 4/2001 | Mellberg et al. | ............. 361/704 |
| 6,226,185 B1 | * | 5/2001 | Lin | ............................ 361/704 |

* cited by examiner

Primary Examiner—Anthony Dinkins
Assistant Examiner—Carmelo Oliva
(74) Attorney, Agent, or Firm—Rosenberg, Klein & Lee

(57) ABSTRACT

The present invention proposes an improved structure for preventing electromagnetic interference (EMI) of a central processing unit (CPU), which structure includes a base, a shielding element, at least a first pin, and at least a second pin. The present invention is characterized in that fixing pins are formed by extending downwards two opposite sides of the shielding element. When the shielding element is closed, it can be firmly gripped at two sides of the base via the fixing pins thereof. Because the shielding element can be steadily closed, the lapping parts thereof can contact exactly with the main body of the second pin so that the second pin can be electrically grounded with the motherboard. Therefore, better electromagnetic shielding function can be achieved. Moreover, the bottom ends of the solder parts of the first pin and the second pin are bent to form flat shapes so that solder parts thereof can be soldered on the motherboard by using the surface mounting technique. The first pin and the second pin need not be plugged into the motherboard so that connection holes are no longer required on the motherboard. Therefore, the circuit layout of the motherboard will not be influenced.

2 Claims, 5 Drawing Sheets

US 6,346,672 B1

STRUCTURE FOR PREVENTING ELECTROMAGNETIC INTERFERENCE OF CENTRAL PROCESSING UNIT

FIELD OF THE INVENTION

The present invention relates to an improved structure for preventing electromagnetic interference of a central processing unit and, more particularly, to a structure for preventing electromagnetic interference of a central processing unit, which structure can achieve better electromagnetic shielding effect. Moreover, through holes need not to be disposed on the motherboard.

BACKGROUND OF THE INVENTION

The central processing unit (CPU) is the center of a computer. It processes data transferring from various kinds of devices, and transfers data to correct devices for executing after some judgments and calculations. Therefore, the CPU can be said to be the brain of a computer.

A prior art structure for preventing electromagnetic interference (EMI) of a CPU comprises a base, a shielding element, two first pins, and two second pins. Two first pin sockets are installed at one side of the base, and two second pin sockets are installed at the other side of the base. Each of the pin sockets has pin receiving holes. One side of the shielding element has a pivot joint, and the other side thereof has a lapping part. Each of the first pins has a main body extending to form a plugging part. The main bodies of the first pins are pivotally connected to the pivot joints at one side of the shielding element. The plugging parts of the first pins are plugged in the first pin sockets of the base with the bottom ends of the plugging parts protruding out of the bottom of the base. Each of the second pins has a main body extending to form a plugging part. The plugging parts of the second pins are plugged in the second pin sockets of the base with the bottom ends of the plugging parts protruding out of the bottom of the base. The shielding element can be closed or unfolded. When the shielding element is closed, it can cover over the CPU with the lapping parts at one side thereof lapping on the second pins. The shielding element uses the pivot joints and the lapping parts to contact with the first pins and the second pins. The first pins and the second pins can be mounted in the motherboard. Through the contact of the first pins and the second pins with the motherboard to acquire electrically grounding function, the shielding element can provide good electromagnetic shielding effect.

Although the above structure can provide good electromagnetic shielding effect, because the shielding element thereof is pivotally connected to the first pins via the pivot joints so that the shielding element can be unfolded, the fixing effect is not good. Therefore, when the shielding element is closed, if the lapping part thereof does not contact exactly with the second pins, the electrically grounding function will be influenced so as to deteriorate the electromagnetic shielding effect of the shielding element.

Morever, because the first pins and the second pins of the above structure meed to be mounted in the motherboard via the plugging parts thereof, connection holes must be disposed on the motherboard in advance. The circuit layout of the motherboard must bypass or circumvent the connection holes, thereby limiting the flexibility of the circuit layout.

SUMMARY AND OBJECTS OF THE PRESENT INVENTION

The primary object of the present invention is to provide an improved structure for preventing EMI of a CPU, wherein fixing pins are formed at two opposite sides of the shielding element. When the shielding element is closed, it can be firmly gripped at two sides of the base via the fixing pins thereof. because the shielding element can be steadily closed, the lapping parts thereof can contact exactly with the main bodies of the second pins so that the second pins can be electrically grounded with the motherboard. Therefore, better electromagnetic shielding function can be achieved.

Another object of the present invention is to provide an improved structure for preventing EMI of a CPU, wherein the bottom ends of the first pins and the second pins are bent to form flat shapes so that solder parts thereof can be soldered on the motherboard by using the surface mounting technique (SMT). The first pins and the second pins need not to be plugged in the motherboard so that connection holes are no longer required on the motherboard. Therefore, the circuit layout of the motherboard will not be influenced.

The various objects and advantages of the present invention will be more readily understood from the following detailed description when read in conjunction with the appended drawings, in which:

DETAILED DESCRIPTION OF PREFERRED EMBODIMENT

Figure 1:
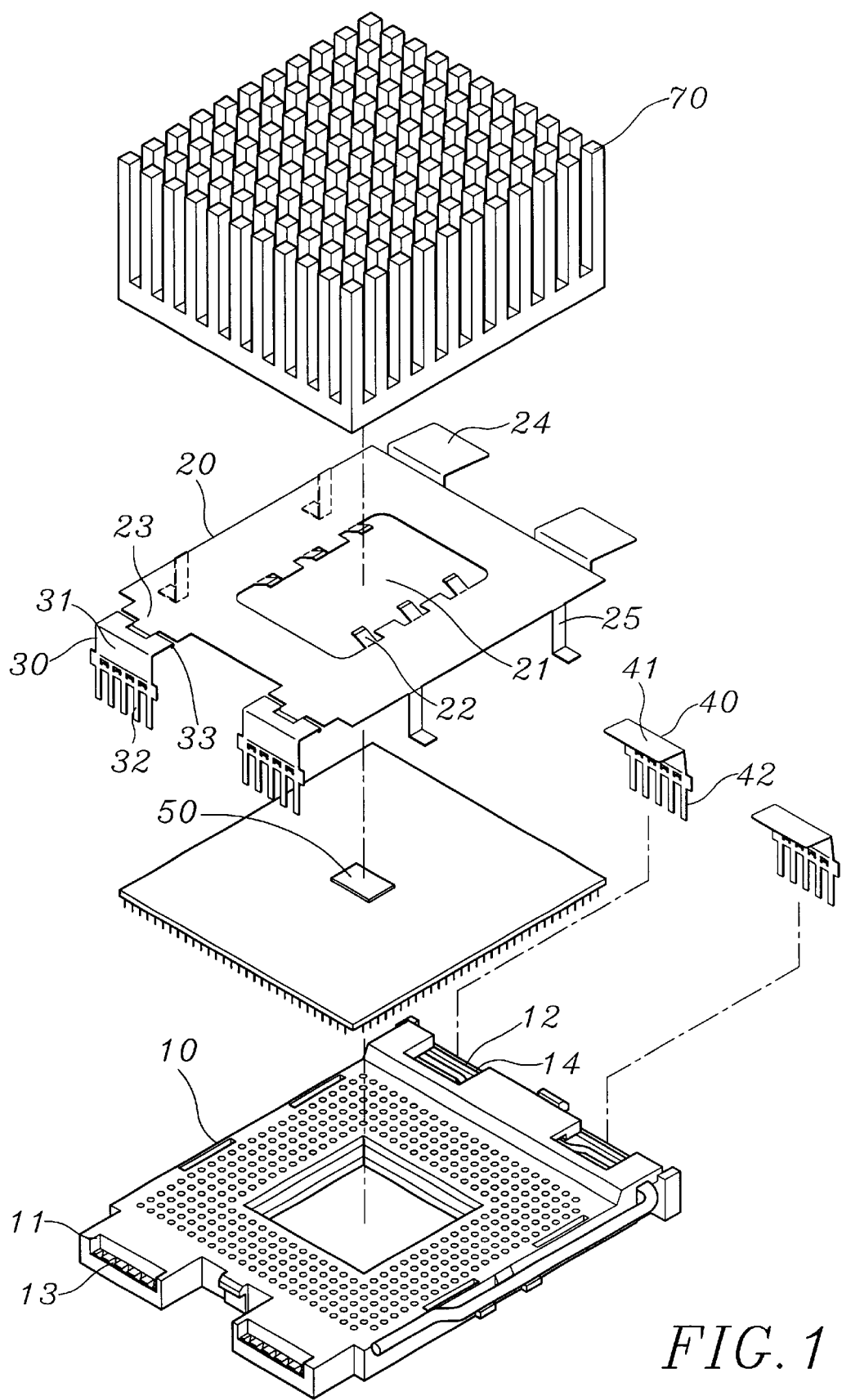
FIG. 1 is an exploded perspective view of the present invention.
Figure 2:
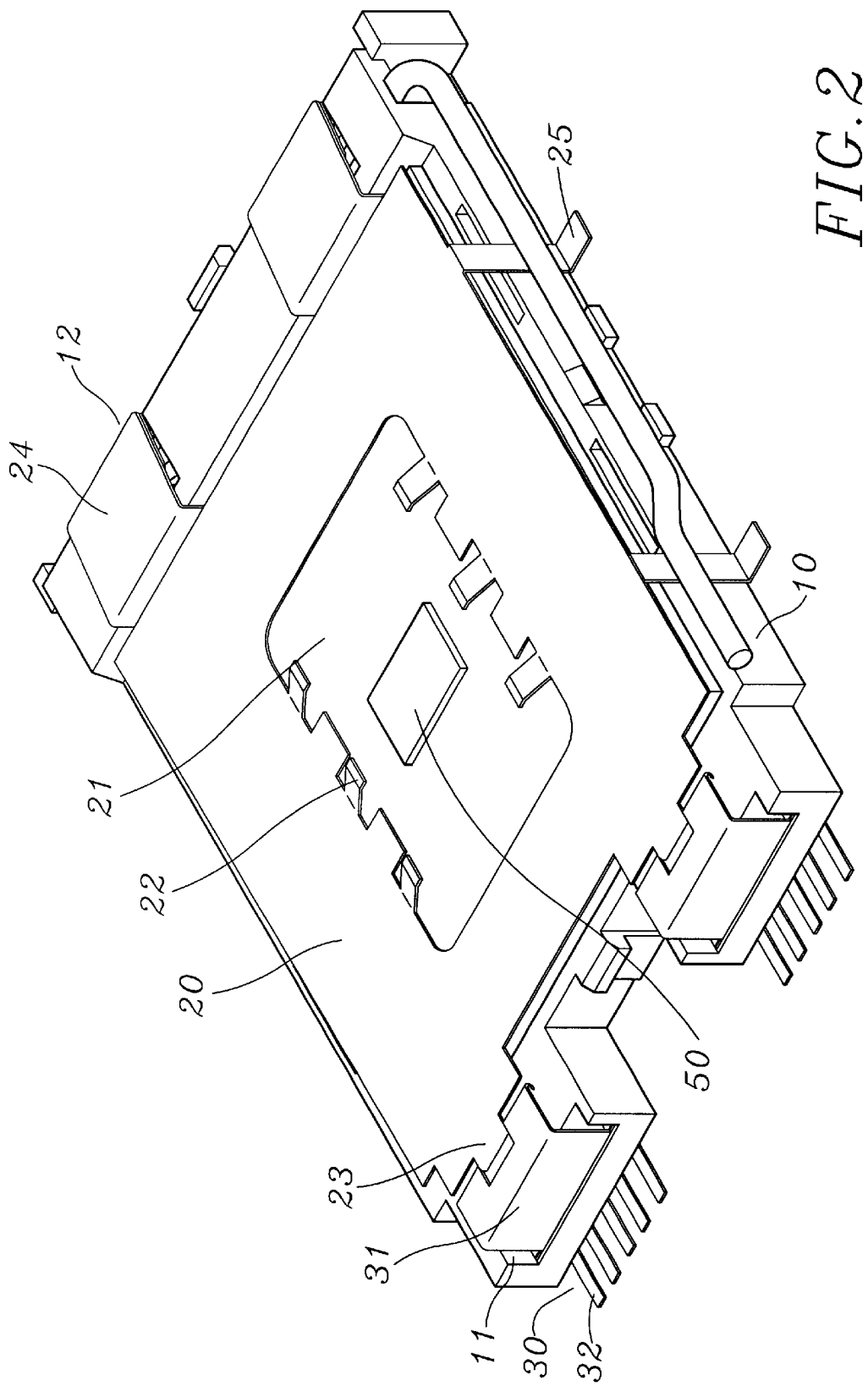
FIG. 2 is a perspective view of the present invention.
Figure 3:
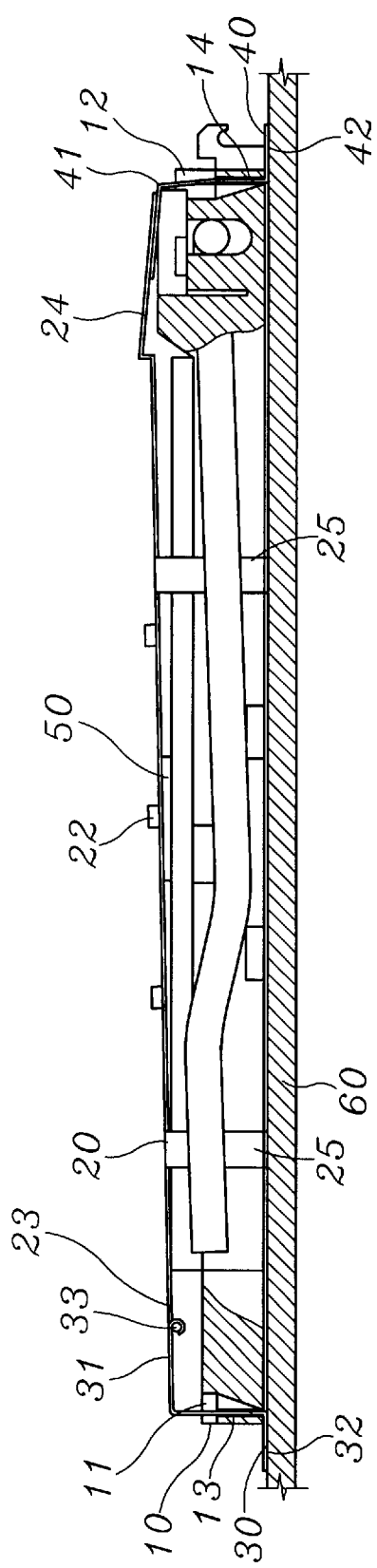
FIG. 3 is a cross-sectional view of the present invention.

As shown in FIGS. 1 to 3, the present invention provides an improved structure for preventing EMI of a CPU, which structure comprises a base 10, a shielding element 20, two first pins 30, and two second pins 40. The base 10 is a general zero insertion force (ZIF) connector. Two first pin sockets 11 are installed at one side of the base 10, and two second pin sockets 12 are installed at the other side thereof. A plurality of pin receiving holes 13 and 14 penetrating from top to bottom are respectively formed on the pin sockets 11 and 12.

The shielding element 20 is made of resilient metal material. The shielding element 20 is a rectangular plate with an opening 21 at the center thereof. A plurality of resilient leaves 22 projecting upwards are installed at the edges of the opening 21. One end of each of the resilient leaves 22 forms a free end. Two pivot joints 23 are installed at one side of the shielding element 20. The two pivot joints 23 correspond to the two first pin sockets 11 of the base 10. Two lapping parts 24 are installed at the opposite side of the shielding element 20. The two lapping parts 24 are higher than the shielding element 20 and are slanting. The two lapping parts 24 correspond to the two second pin sockets 12 of the base 10. Two fixing pins 25 are formed by extending downwards each of another two opposite sides of the shielding element. One end of each of the fixing pins 25 forms a free end.

The first pins 30, each having a main body 31, are made of metal material. The main body 31 is properly bent. The bottom end of the main body 31 extends to form a plurality of solder parts 32. The top end of the main body 31 of each of the first pin 30 is pivotally connected to one of the two pivot joints 23 of the shielding element 20 via a pivot 33 so that the two first pins 30 are pivotally connected to one side of the shielding element 20. The solder parts 32 of the two first pins 30 are then mounted in the pin-receiving holes 13 of the two first pin sockets 11 of the base 10. The bottom ends of the solder parts 32 of the two first pins 30 protrude out of the bottom of the base 10 a certain length. The bottom ends of the solder parts 32 are bent to form flat shapes (shown in FIGS. 2 and 3). Thereby, the shielding element 20 can be closed or unfolded with the pivots 33 as the axis.

The second pins 40, each having a main body 4 1, are made of metal material. The main body 41 is properly bent and is slanting. The bottom end of the main body 41 extends to form a plurality of solder parts 42. The solder parts 42 of the two second pins 40 are then mounted in the pin-receiving holes 14 of the two second pin sockets 12 of the base 10. The bottom ends of the solder parts 42 of the two second pins 40 protrude out of the bottom of the base 10 a certain length. The bottom ends of the solder parts 42 are bent to form flat shapes. An improved structure for preventing EMI of a CPU according to the present invention is thus formed.

As shown in FIGS. 2 and 3, a CPU 50 can be mounted in the base 10. The shielding element 20 is then closed with the pivots 33 as the axis so that the shielding element 20 covers over the CPU 50. The shielding element 20 can thus provide electromagnetic shielding effect for the CPU 50. The two lapping parts 24 at the free end of the shielding element 20 lap on the main bodies 41 of the two second pins 40. When the base (connector) 10 is mounted in a motherboard 60, the solder parts 32 and 42 of the two first pins 30 and the two second pins 40 can be soldered on the motherboard 60 by using the SMT, respectively. The two first pins 30 and the two second pins 40 can thus contact with the motherboard 60.

Figure 4:
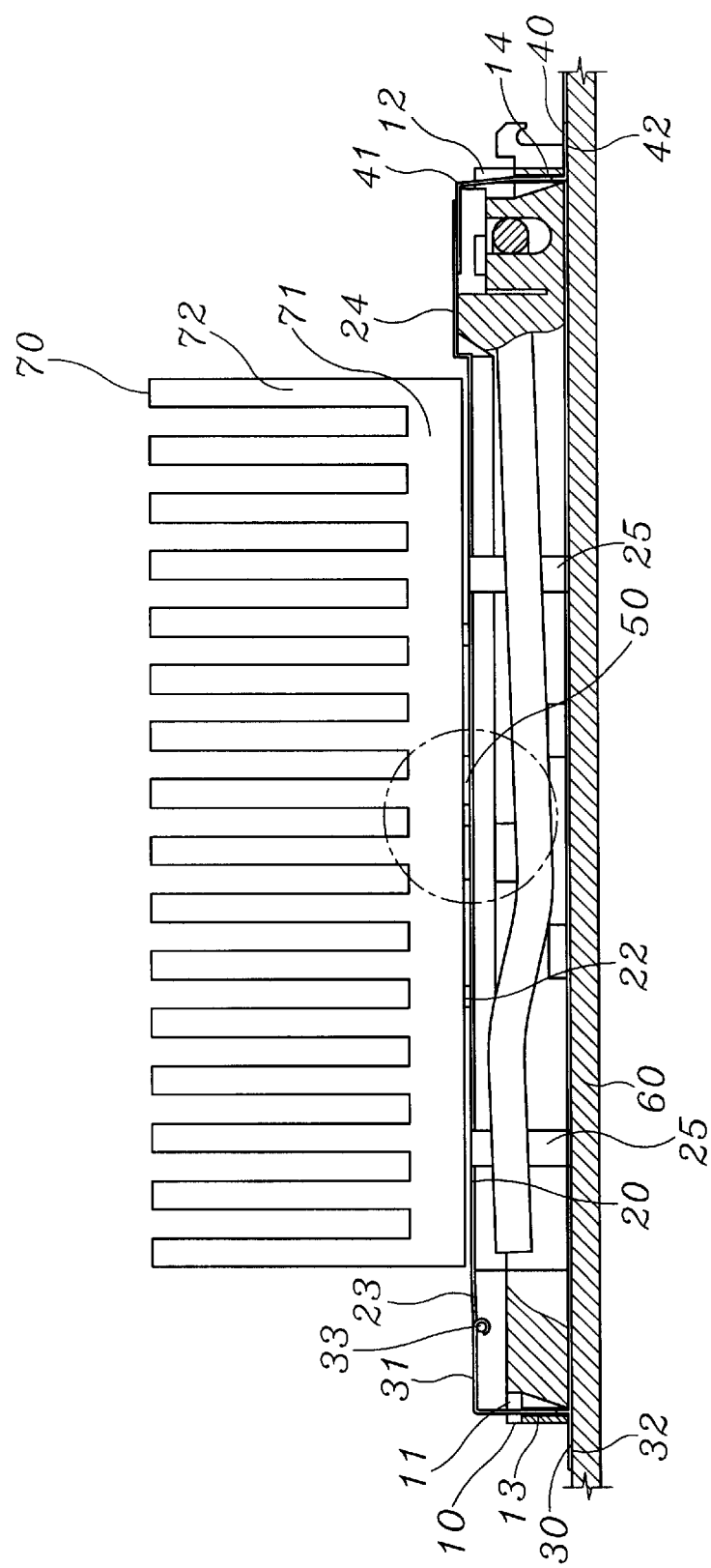
FIG. 4 is a cross-sectional view of the present invention with a heat radiator attached.
Figure 4A:
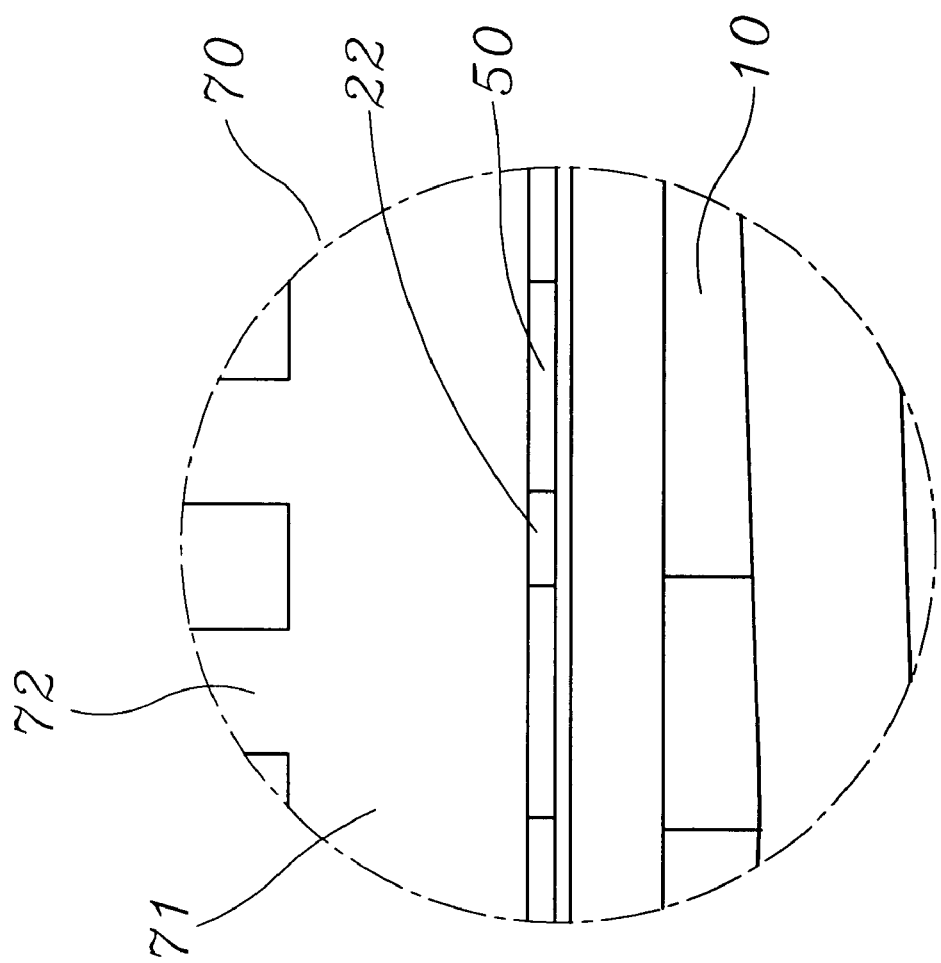
FIG. 4A is a locally enlarged view of FIG. 4.

As shown in FIGS. 4 and 4A, a general heat radiator 70 can be installed above the shielding element 20. The heat radiator 70 comprises a bottom board 71 and a plurality of fins 72. The fins 72 are alternately spaced and are connected to the bottom board 71. The top of the CPU 50 contacts with the bottom of the heat radiator 70 through the opening 21 of the shielding element 20. The heat radiator 70 can be fastened via a retaining element (not shown) so that heat generated by the CPU 50 can be conducted to the heat radiator 70 for increasing heat-radiating effect. Moreover, the heat radiator 70 can press on the resilient leaves 22 of the shielding element 20 so that the shielding element 20 can stick tightly to the CPU 50.

The shielding element 20 of the present invention uses the pivot joints 23 and the lapping parts 24 at two sides thereof to contact with the first pins 30 and the second pins 40. Moreover, the first pins 30 and the second pins 40 are mounted in the motherboard 60. Through the contact of the first pins 30 and the second pins 40 with the motherboard 60 to acquire electrically grounding function, the shielding element 20 can provide good electromagnetic shielding effect. Better shielding effect of EMI for the CPU 50 can thus be achieved.

Because a plurality of fixing pins 25 are formed at two opposite sides of the shielding element 20, when the shielding element 20 are closed with the pivots 33 as the axis to cover over the CPU 50, it can be firmly gripped at two sides of the base 10 via the fixing pins 25. Because the shielding element 20 can thus be steadily closed, the lapping parts 24 thereof can contact exactly with the main bodies 41 of the two second pins 40 so that the two second pins 40 can be electrically grounded with the motherboard 60. Therefore, better electromagnetic shielding function of the shielding element 20 can be achieved.

Moreover, the first pins 30 and the second pins 40 are soldered on the motherboard 60 via the solder parts 32 and 42 thereof by using the SMT, respectively. The first pins 30 and the second pins 40 need not to be plugged in the motherboard 60 so that connection holes are no longer required on the motherboard 60. Therefore, the circuit layout of the motherboard 60 will not be influenced.

Although the present invention has been described with reference to the preferred embodiments thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

I claim:

1. A shielding structure for preventing electromagnetic interference of a central processing unit comprising:

a base member having first and second pairs of pin sockets formed thereon, said first and second pairs of pin sockets being positioned on opposing side edges of said base member and extending therefrom, each of said pin sockets having a set of pin receiving recesses formed therethrough;

a shielding plate having a substantially planar shape and having a pair of pivot joints extending outwardly from a first longitudinal edge of said shielding plate and a pair of contact members extending outwardly from a second longitudinal edge of said shielding plate and first and second pairs of fixing pins respectively projecting from opposed lateral edges thereof, said contact members being substantially planar and positioned at an inclined angle to said shielding plate, said pairs of fixing pins removably contacting said base member when said shielding plate covers and electromagnetically shields an integrated circuit chip;

a pair of first conductive pin members each having a main body portion with a plurality of electrical leads projecting therefrom, said main body portions being respectively pivotally connected to said pair of pivot joints of said shielding plate, said plurality of electrical leads being received in and projecting through said sets of pin receiving recesses of said first pair of pin sockets; and, a pair of second conductive pin members each having a main body portion with a plurality of electrical leads projecting therefrom, said main body portions being in electrical communication with said pair of contact members when said shielding plate covers and electromagnetically shields said integrated circuit chip, said main body portions being in biased contact with said contact members, said plurality of electrical leads of said pair of second conductive pin members being received in and projecting through said sets of pin receiving recesses of said second pair of pin sockets.

2. The shielding structure for preventing electromagnetic interference of a central processing unit as recited in claim 1 wherein said electrical leads of said conductive pin members are positioned substantially parallel to said shielding plate when said electrical leads are received within said pin receiving recesses.

* * * * *